(12) United States Patent
Yokoi

(10) Patent No.: US 7,494,864 B2
(45) Date of Patent: Feb. 24, 2009

(54) METHOD FOR PRODUCTION OF SEMICONDUCTOR DEVICE

(75) Inventor: Naoki Yokoi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 292 days.

(21) Appl. No.: 11/556,488

(22) Filed: Nov. 3, 2006

(65) Prior Publication Data
US 2007/0105296 A1    May 10, 2007

(30) Foreign Application Priority Data

| Nov. 4, 2005 | (JP) | ............................. 2005-321202 |
| Sep. 1, 2006 | (JP) | ............................. 2006-237983 |

(51) Int. Cl.
*H01L 21/8242* (2006.01)

(52) U.S. Cl. ................. 438/241; 438/592; 257/E21.649

(58) Field of Classification Search ................. 438/210, 438/241, 592; 257/E21.649
See application file for complete search history.

(56) References Cited

U.S. PATENT DOCUMENTS

| 6,187,624 B1 * | 2/2001 | Huang ......................... 438/253 |
| 6,759,720 B2 * | 7/2004 | Shinkawata ................. 257/413 |
| 7,078,758 B2 * | 7/2006 | Shinkawata ................. 257/300 |

FOREIGN PATENT DOCUMENTS

| JP | 7-183506 A   | 7/1995 |
| JP | 7-221298 A   | 8/1995 |
| JP | 9-293689 A   | 11/1997 |
| JP | 11-111691 A  | 4/1999 |
| JP | 2000-77535 A | 3/2000 |
| JP | 2000-315661 A | 11/2000 |
| JP | 2001-102550 A | 4/2001 |
| JP | 2004-039943 A | 2/2004 |
| JP | 2005-285929 A | 10/2005 |
| JP | 2005-303170 A | 10/2005 |

* cited by examiner

*Primary Examiner*—Chandra Chaudhari
(74) *Attorney, Agent, or Firm*—Sughrue Mion, PLLC

(57) ABSTRACT

A method for production of a semiconductor device including the steps of: forming a gate insulating film, a polysilicon film and a first insulating film on a silicon substrate; patterning the first insulating film; forming a metal film; forming a silicide layer by reacting the polysilicon film with the metal film; forming a second insulating film after removing an unreacted metal film; removing the second insulating film such that the first insulating film is exposed and the second insulating film remains on a region which is not covered with the first insulating film; forming a gate electrode having a silicide layer on the upper layer side and a polysilicon layer on the lower layer side by carrying out etching using the second insulating film as a mask after removing the first insulating film; forming a third insulating film on the side surface of the gate electrode; and forming an interlayer insulating film and forming a contact hole therein.

5 Claims, 9 Drawing Sheets

FIG. 2
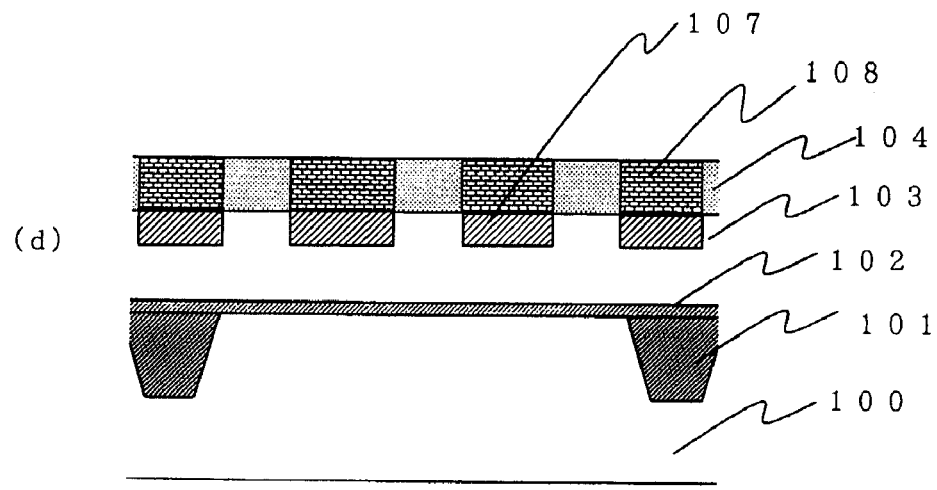
(d)
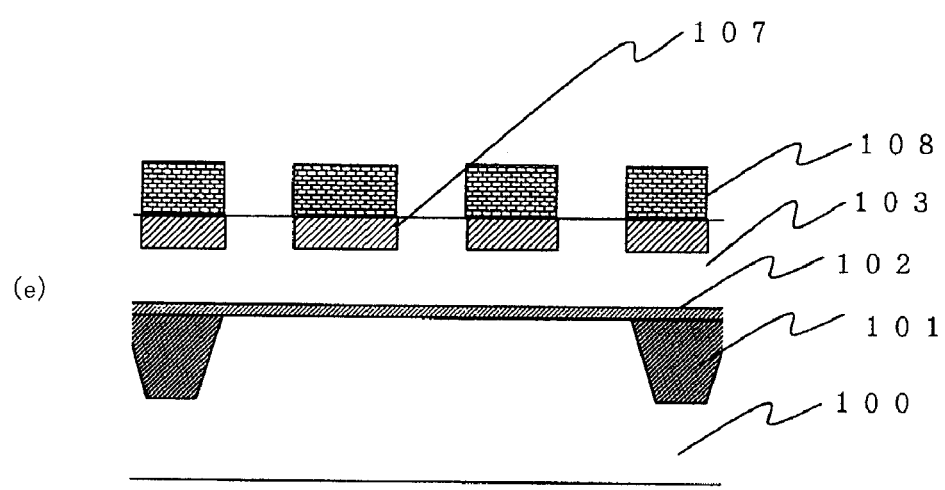
(e)
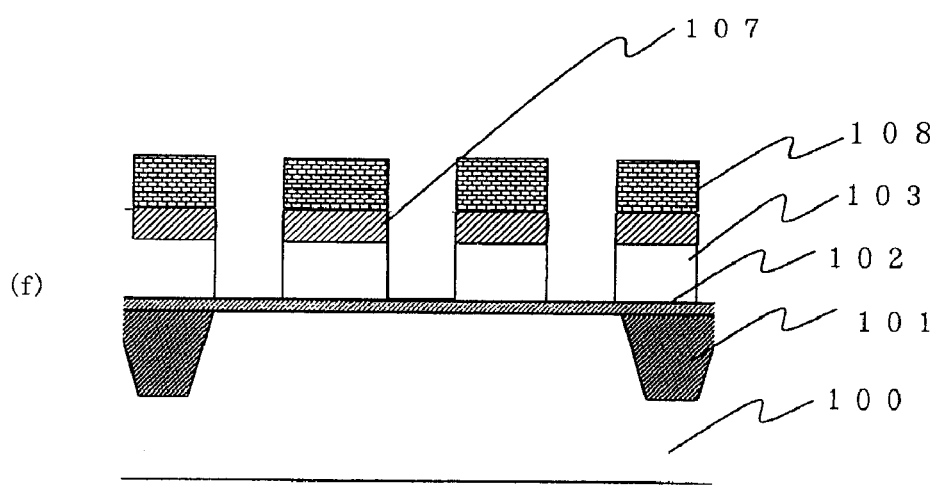
(f)

FIG. 3
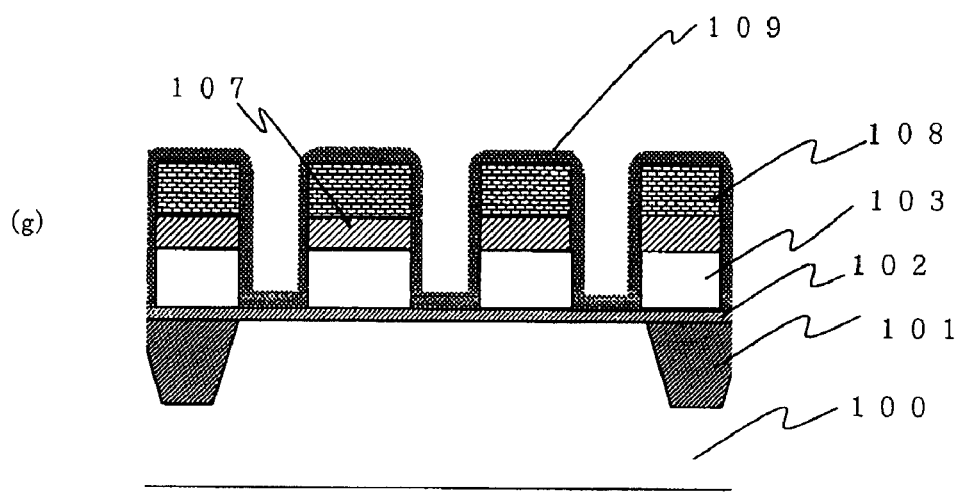
(g)
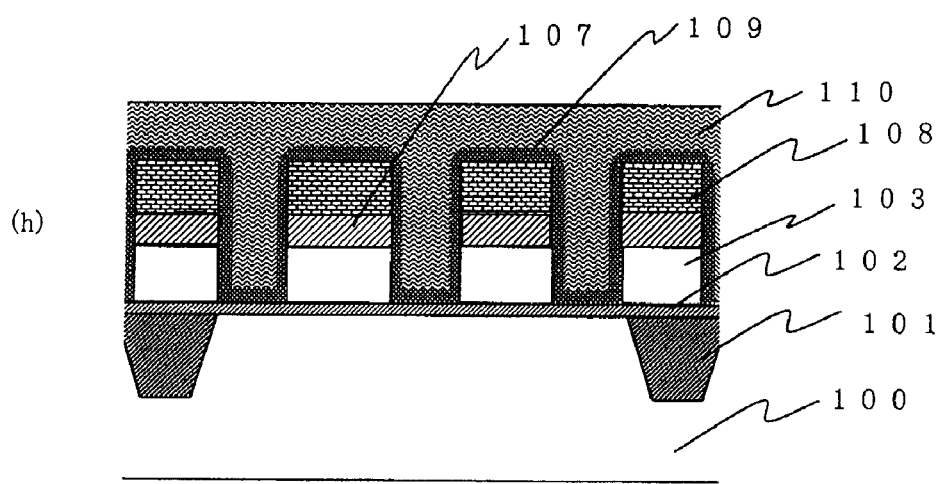
(h)
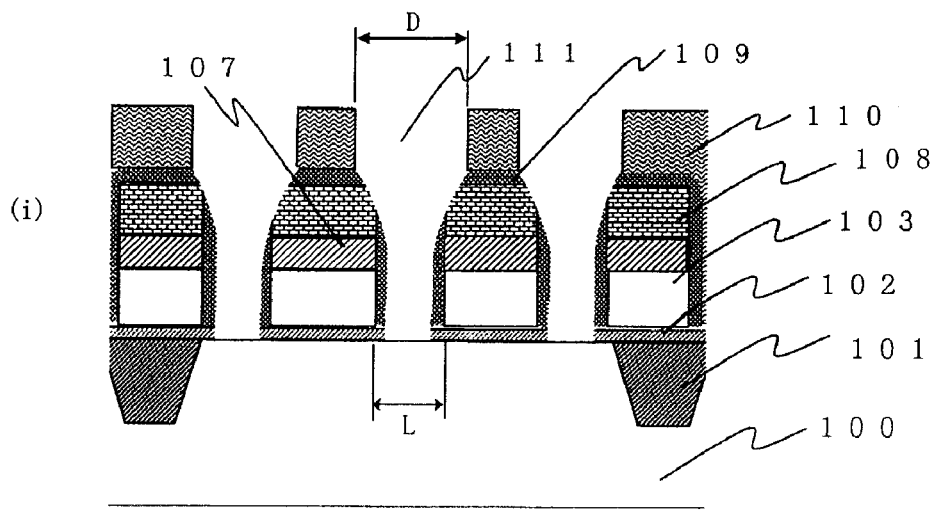
(i)

FIG. 5     (BACKGROUND ART)
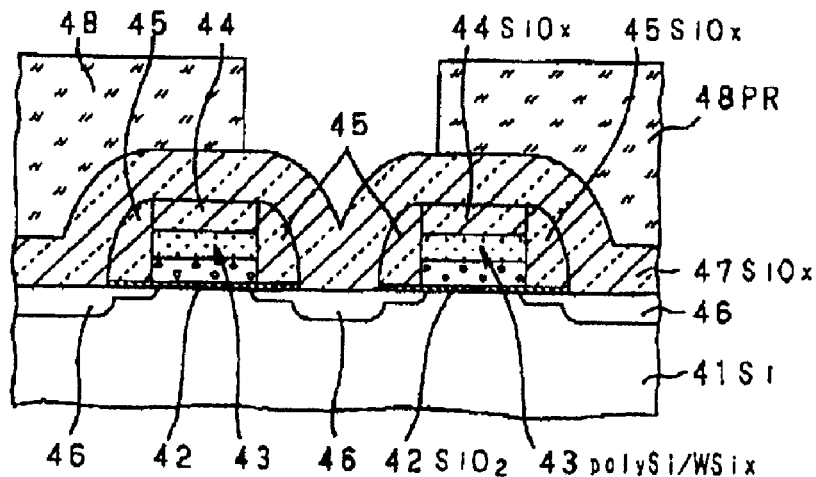
FIG. 6     (BACKGROUND ART)
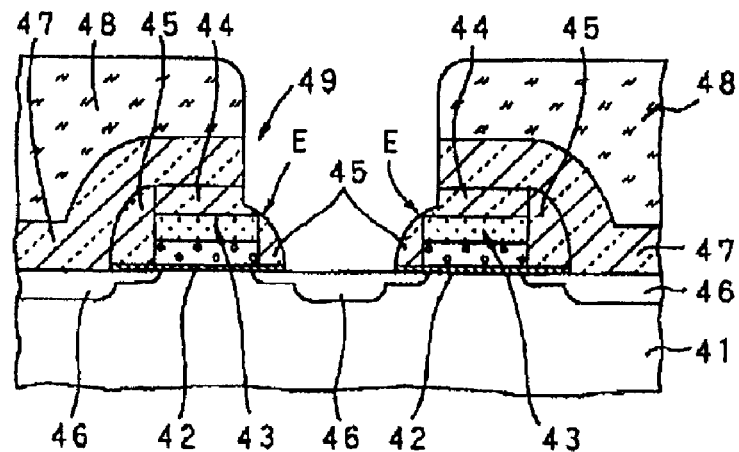

METHOD FOR PRODUCTION OF SEMICONDUCTOR DEVICE

BACKGROUND OF THE INVENTION

1. Field of the Invention

The present invention relates to a method for production of a semiconductor device, and particularly to a method for production of a semiconductor device having a self-aligned contact structure.

2. Description of the Related Art

Semiconductor integrated circuit devices are under enhancement of speeds of transistors due to reduction of a parasitic capacitance and miniaturization of wirings for reduction of a production cost per unit element.

However, if the gate length of an MOS field effect transistor (MOSFET) decreases (particularly to 0.35 μm or less), a problem of a deterioration in transistor characteristics resulting from an increase in resistance of a wiring (gate electrode) or a parasitic resistance of a source/drain diffusion layer occurs. Therefore, a silicide gate is used for the purpose of reducing a wiring resistance.

In a logic type semiconductor integrated circuit device, a salicide (self-aligned silicide) structure in which a silicide is formed in a self-aligned manner on a gate electrode and a source/drain diffusion layer for reduction of a resistance is applied.

For increasing a density, a technique of self-aligned contact (hereinafter referred to as "SAC") is applied when forming a contact connected to a diffusion layer shared by mutually adjacent elements in a DRAM (dynamic random access memory).

In recent years, the wiring has been further miniaturized, and in the DRAM, a material having a resistance lower than that of a tungsten silicide that has been previously used is needed.

In the logic type semiconductor integrated circuit device, the titanium silicide that has been previously used undergoes an increase in resistance due to occurrence of coagulation resulting from miniaturization of the wiring, and therefore development of a technique of using a cobalt silicide and a nickel silicide is underway.

The production process of the DRAM has the following problems in addition to the problems described above.

In the DRAM, the impurity concentration of the source/drain diffusion layer is reduced for inhibition of a short channel effect and alleviation of a drain field, and therefore the diffusion layer is so thin that there is a possibility that silicide formation increases a leak current. When a silicide layer is formed on a gate electrode by a process of forming a salicide structure (hereinafter referred to as "salicide process"), an etching stopper insulating film for formation of a SAC structure cannot be selectively provided just above the gate electrode. From these considerations, it has been difficult to apply the conventional salicide process directly to the production process of the DRAM having an SAC structure.

Methods for forming the SAC structure and the salicide structure will be described in detail below using the drawings.

FIGS. 5 to 8 are schematic sectional views for explaining a process of formation of the SAC structure (hereinafter referred to as "SAC process") disclosed in Japanese Patent Laid-Open No. 9-293689.

In the DRAM, in a pair of adjacent FETs (field effect transistors), each FET shares one of a pair of diffusion layers which is between FETs, and a contact plug connected to this diffusion layer is formed by an SAC process. The other diffusion layer of each FET is connected to an electrode of a corresponding capacitance element.

FIG. 5 is an explanatory view of a process of forming a contact connecting a diffusion layer common in a pair of adjacent FETs to a wiring (bit line), and shown a state in which a resist pattern is formed on an interlayer insulating film for opening a contact hole in a self-aligned manner. A step to this point is carried out in a manner described below.

First, silicon substrate 41 (Si) subjected formation of wells and element isolation beforehand is prepared. On the surface of this substrate are formed gate electrodes 43 (polySi/WSi$_x$) via gate oxide films 42 (SiO$_2$) formed by thermal oxidization. These gate electrodes 43 each have its top surface covered with offset oxide film 44 (SiO$_x$) and its side surface covered with side wall 45 (SiO$_x$). On the surface layer portion of silicon substrate 41, source/drain regions 46 having an LDD structure are formed in a self-aligned manner with respect to gate electrodes 43 and side walls 45. SiO$_x$ interlayer insulating film 47 is formed in a conformal form on the entire surface of the substrate. Here, the reason why SiO$_x$ interlayer insulating film 47 is formed not flatly but in a conformal form is that it is necessary to initially set a thickness of the interlayer insulating film so that a contact hole can be opened without necessity to carry out excess over-etching, since in this method, a selection ratio to underlying offset oxide film 44 and side wall 45 cannot be secured theoretically at a stage of etching for formation of the contact hole described later.

Next, on this film is formed resist pattern 48 (PR) by carrying out a photolithography step. The opening of resist pattern 48 is sufficiently large compared to a space between adjacent gate electrodes 43. Subsequently, SiO$_x$ interlayer insulating film 47 is dry-etched using resist pattern 48 as a mask. This etching is carried out until Si substrate 41 is exposed, so that contact hole 49 shown in FIG. 6 is formed.

As another method, there is a method in which the interlayer insulating film is flattened by using an etching stopping film. That is, as shown in FIG. 7, the steps until the patterning of gate electrodes 43 and offset oxide films 44 and the formation of side walls 45 are carried out as described above, and thereafter, the entire surface of the substrate is thinly coated with conformal SiN etching stopping film 50, followed by forming SiO$_x$ interlayer insulating film 51 to substantially flatten the entire surface. Next, on this film is formed resist pattern 52 (PR) by carrying out a photolithography step. The opening of resist pattern 52 is sufficiently large compared to a space between adjacent gate electrodes 43.

SiO$_x$ interlayer insulating film 51 is dry-etched using resist patter 52 as a mask. This etching is carried out under a condition allowing a high selection ratio to be achieved with respect to underlying SiN etching stopping film 50. The reason why SiO$_x$ interlayer insulating film 51 can be flattened is that even if over-etching is carried out in this stage, etching is stopped at the surface of SiN etching stopping film 50, and offset oxide film 44 and side wall 45 are protected. When SiN etching stopping film 50 is exposed, this film is then etched under a condition allowing a high selection ratio to be achieved with respect to offset oxide film 44 and side wall 45, so that contact hole 53 shown in FIG. 8 is completed.

FIGS. 9(a) to 9(d) and 10(a) to 10(c) are schematic sectional views for explaining a salicide process disclosed in Japanese Patent Laid-Open No. 7-183506.

An MOS transistor having a salicide structure is produced in a manner described below. First, gate oxide film 202 is formed on the surface of monocrystalline P type silicon substrate 201 having a (100) surface orientation. Polycrystalline silicon film 233 having a thickness of about 0.2 μm is deposited on the surface of gate oxide film 202 by a low pressure chemical vapor deposition (LPCVD) method. The temperature at which polycrystalline silicon film 233 is grown is about 600° C., and in film formation at this temperature, the film is formed as a polycrystalline film, and the obtained film is a polycrystalline silicon film in which (110) orientation is dominant. The grain size (diameter of crystal grain) of polycrystalline silicon film 233 at this stage is about 0.5 μm to 1.0 μm (see FIG. 9(a)).

Next, polycrystalline silicon film 233 is patterned using a publicly known lithography technique to form polycrystalline silicon film 233a. By ion implantation of an N type impurity using polycrystalline silicon film 233a as a mask, a low-concentration N type diffusion layer 235A is formed on the surface of P type silicon substrate 201. Thereafter, silicon oxide film 234 having a thickness of about 0.2 μm is deposited on the entire surface by the CVD method (see FIG. 9(b)).

Next, silicon oxide film 234 is subjected to anisotropic plasma etching, this silicon oxide film remains only on the side wall of polycrystalline silicon film 233a, and spacer 234a consisting of this silicon oxide film is formed. Ion implantation of an N type impurity is carried out using spacer 234a and polycrystalline film 233a as a mask, followed by carrying out lamp annealing to form a high-concentration N type diffusion layer 235B on the surface of P type silicon substrate 201 (surface of N type diffusion layer 235A). N type diffusion layer 235A and N type diffusion layer 235B form N type source/drain diffusion layer 235 of LDD type (see FIG. 9(c)). In this connection, polycrystalline silicon film 233a at this stage is a high-concentration N type film, but polycrystalline silicon film 233 at a film formation sage may be formed into an N-type film beforehand.

After the surface is cleaned with a fluoric acid, titanium film 236 having a desired thickness is deposited on the entire surface (see FIG. 9(d)).

Subsequently, a first heat treatment for a silicide formation reaction is carried out in an inert atmosphere or vacuum to form a titanium silicide film 237a on the surface of N type source/drain diffusion layer 235 and the surface of polycrystalline silicon film 233a. The crystal structure of the crystal grain of titanium silicide film 237a is a C49 structure. This heat treatment is carried out at 700° C. for about a second. At a higher temperature, inter-diffusion between silicon and titanium is so vigorous that formation of a titanium silicide film as a "layer" becomes difficult (see FIG. 10(a)).

Next, unreacted titanium film 236 is removed by a mixed aqueous solution of ammonium hydroxide ($NH_4OH$) and hydrogen peroxide ($H_2O_2$) (see FIG. 10(b)).

Subsequently, a second heat treatment is carried out by lamp annealing at 800 to 900° C., so that titanium silicide layer 237a on the surface of polycrystalline silicon film 233a is converted into titanium silicide film 237ba and titanium silicide film 237a on the surface of N type source/drain diffusion layer 235 is converted into titanium silicide film 237bb. Consequently, gate electrode 238 consisting of N type polycrystalline silicon film 233a and titanium silicide film 237ba and source/drain region 239 consisting of N type source/drain diffusion layer 235 and titanium silicide film 237bb are obtained, and an N channel type MOS transistor having a salicide structure is formed. The crystal structure of the crystal grain of titanium silicide films 237ba and 237bb is a C54 structure, and the thickness of titanium silicide films 237ba and 237bb is about 30 to 35 nm (see FIG. 10(c)).

Techniques of forming a salicide structure using titanium silicide ($TiSi_2$) formed by a reaction between titanium (Ti) and silicon (Si) as described above are widely applied according to miniaturization of the wiring.

However, further miniaturization of the wiring results in coagulation of titanium silicide, so that low-resistance titanium silicide is hard to be obtained. Accordingly, employment of cobalt silicide or nickel silicide, instead of titanium silicide, is under consideration.

Particularly in cobalt silicide ($CoSi_2$), Co diffuses into Si and does not adsorb up Si as Ti does at the time of the silicide formation reaction between Ti and Si when cobalt silicide is formed by a silicide formation reaction between Co and Si, and therefore a short between silicide regions does not occur.

Cobalt silicide and nickel silicide have a low resistance, and are also preferable as a silicide material of the DRAM having an SAC structure. However, for cobalt silicide and nickel silicide, patterning by dry etching is difficult, and therefore it is difficult to form a gate pattern having a cobalt silicide layer or a nickel silicide layer on the upper layer side thereof.

When a silicide layer is formed on a gate electrode by the salicide process, an etching stopper insulating film for formation of the SAC structure cannot be selectively provided just above the gate electrode.

Therefore, a conventional SAC process could not be applied directly when forming the SAC structure having a silicide gate.

SUMMARY OF THE INVENTION

It is an object of the present invention to provide a method capable of producing a semiconductor device having a self-aligned contact structure even when a material difficult to dry-etch is used for a material of a gate electrode.

According to the present invention, methods for production of semiconductor devices of the following aspects can be provided.

(1) A method for production of a semiconductor device, comprising the steps of:

forming a gate insulating film, a polysilicon film and a first insulating film on a silicon substrate;

forming on the first insulating film a mask having an opening pattern corresponding to a pattern of a gate electrode which is subsequently formed;

patterning the first insulating film by removing the first insulating film until the polysilicon film is exposed using the mask;

forming on the polysilicon film a metal film for forming a silicide;

forming a silicide layer by reacting the polysilicon film with the metal film contacting a portion not covered with the first insulating film;

removing an unreacted metal film;

forming on the polysilicon film having the silicide layer formed thereon, a second insulating film of which the etching rate is lower than that of the first insulating film in etching for removal of the first insulating film which is subsequently carried out;

removing the second insulating film such that the first insulating film is exposed and the second insulating film remains on a region which is not covered with the first insulating film;

removing the first insulating film by etching;

forming a gate electrode having a silicide layer on the upper layer side and a polysilicon layer on the lower layer side by etching the polysilicon film using the remaining second insulating film as a mask;

forming a third insulating film of which the etching rate is lower than an interlayer insulating film in etching for forming a contact hole in the interlayer insulating film which is subsequently formed, so as to cover at least the side surface of the gate electrode;

forming the interlayer insulating film; and forming the contact hole in the interlayer insulating film by etching.

(2) The method for production of a semiconductor device according to item (1), wherein the metal film is a cobalt film or a nickel film.

(3) The method for production of a semiconductor device according to item (1) or (2), wherein the first insulating film is a silicon oxide film, and the second insulating film and the third insulating film are silicon nitride films.

(4) The method for production of a semiconductor device according to any of items (1) to (3), wherein the contact hole is provided so as to extend to the top of silicon substrate between adjacent gate electrodes, and the opening diameter of the contact hole is larger than the minimum spacing between the gate electrodes.

(5) The method for production of a semiconductor device according to any of items (1) to (4), wherein the method comprises a step of forming a side wall insulating film on the side surface of the second insulating film after the step of removing the first insulating film by etching, and in the step of forming the gate electrode, the polysilicon film is dry-etched using the side wall insulating film and the second insulating film as a mask such that the silicide layer is not exposed.

According to the present invention, a semiconductor device having a self-aligned contact structure can be produced even when a material difficult to dry-etch is used for a material of a gate electrode. As a result, a semiconductor device which has a reduced gate resistance, is excellent in transistor characteristics and has elements in high density can be provided.

According to the present invention, a metal film can be formed on a polysilicon film having an insulating film patter formed thereon, and a silicide layer can be formed in a self-aligned manner on a polysilicon portion not covered with the insulating film pattern. A cap layer is formed in a self-aligned manner on the silicide layer using the insulating film pattern, and after the insulating film pattern is removed, the polysilicon film is etched using the cap layer as a mask, whereby a gate electrode having a silicide layer on the upper layer side and a polysilicon layer on the lower layer side can be formed.

The gate electrode having the cap layer thereon is formed so as to correspond to an opening pattern of the insulating film pattern.

According to the present invention, an etching preventing insulating film can be then provided on the side surface of the gate electrode, followed by forming an interlayer insulating film and forming a contact hole on the interlayer insulating film. When the contact hole is formed, the gate electrode is protected by the cap layer formed on the gate electrode and the etching preventing insulating film formed on the side surface of he gate electrode, and thus the gate electrode is not etched in formation of the contact hole for forming a self-aligned contact structure.

As a result, using a low-resistance silicide material difficult to process by dry etching, a gate electrode having a polysilicon layer on the lower layer side and a silicide layer on the upper layer side can be formed, and a self-aligned contact structure capable of densification of elements can be formed.

BRIEF DESCRIPTION OF THE DRAWINGS

FIGS. 2(d), 2(e) and 2(f) are schematic process sectional views showing a method for production of a semiconductor device of the present invention;

FIGS. 3(g), 3(h) and 3(i) are schematic process sectional views showing a method for production of a semiconductor device of the present invention;

FIG. 5 is a schematic sectional view for explaining a conventional method for formation of a self-aligned contact structure (SAC);

FIG. 6 is a schematic sectional view for explaining a conventional method for formation of a self-aligned contact structure (SAC);

DETAILED DESCRIPTION OF THE PREFERRED EMBODIMENTS

Figure 1:
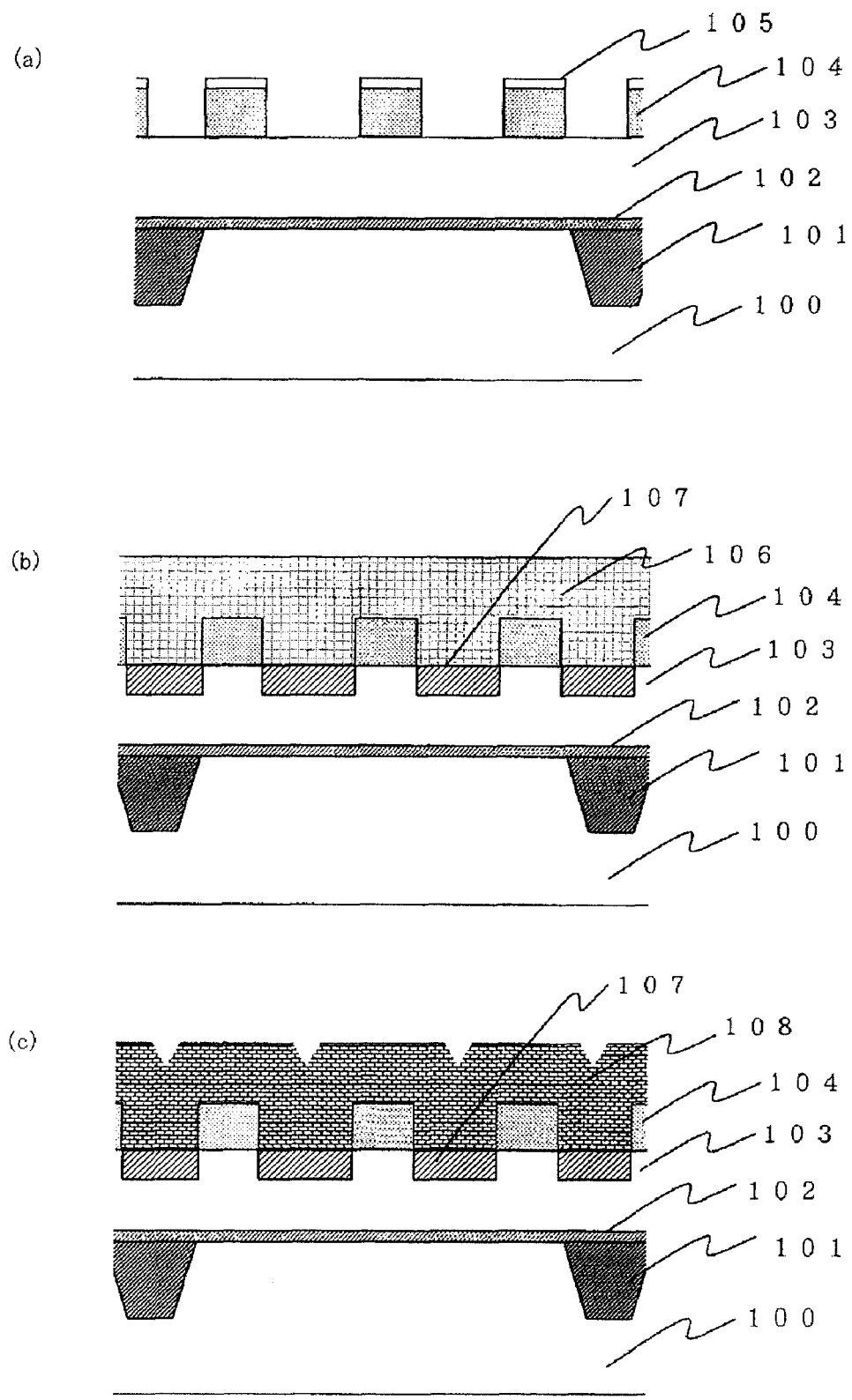
FIGS. 1(a), 1(b) and 1(c) are schematic process sectional views showing a method for production of a semiconductor device of the present invention.

Preferred embodiments of the present invention will be described.

First, gate insulating film 102, polysilicon film 103 and first insulating film 104 are formed on silicon substrate 100 having element isolation region 101 formed thereon. Thereafter, etching mask 105 is formed, and the first insulating film is patterned using the etching mask (FIG. 1(a)).

For etching mask 105, a resist pattern formed using a photolithography method may be used. For first insulating film 104, a silicon oxide film may be used.

Next, silicide layer 107 is formed on polysilicon film 103 in a self-aligned manner with respect to patterned first insulating film 104.

For formation of silicide layer 107, refractory metal film 106 is formed on polysilicon film 103 having patterned first insulating film 104 formed thereon, and an exposed portion of polysilicon film 103 which contacts the refractory metal and is not covered with the first insulating film is made to undergo a silicide formation reaction to form silicide layer 107 (FIG. 1(b)).

The silicide formation reaction between the refractory metal and polysilicon can be carried out by a high-temperature heat treatment in an inert gas atmosphere in which a produced silicide is not oxidized. When cobalt is used as a refractory metal, a silicide can be formed at 700° C., followed by removing unreacted cobalt using an acidic solution, and then the resistance can be reduced by crystallizing the silicide at 800° C. When nickel is used as a refractory metal, a silicide can be formed at 400° C., followed by removing unreacted nickel using an acidic solution, and then the resistance can be reduced by crystallizing the silicide at 500° C.

For the acidic solution for removing unreacted cobalt or nickel, a mixed solution of sulfuric acid and hydrogen peroxide solution, or a mixed solution of hydrochloric acid and hydrogen peroxide solution may be used.

Next, after an unreacted refractory metal is removed, second insulating film (first silicon nitride film) 108 is formed on polysilicon film 103 having first insulating film 104 and silicide layer 107 formed thereon (FIG. 1(c)).

Thereafter, second insulating film 108 is removed until first insulating film, is exposed (FIG. 2(d)). This step may be carried out by wet etching or dry etching, but chemical mechanical polishing (CMP) allowing a flat surface to be formed is preferably carried out.

Next, first insulating film 104 is etched away (FIG. 2(e)). For etching of the first insulating film, either wet etching or dry etching may be used.

First insulating film 104 is not limited as long as it is a film made of a material which can secure a sufficient etching selectivity to the second insulating film, since first insulating film 104 is removed from the substrate when this step is completed.

Second insulating film 108 is not limited as long as it is a film made of a material which can play a role as a cap layer for an etching mask at the time of forming a gate pattern, but for example, a silicon nitride film or a silicon oxy-nitride film is preferably used.

As described above, cap layer 108 made of the second insulating film can be formed in a self-aligned manner with respect to patterned first insulating film 104 (FIG. 2(e)).

Next, polysilicon film 103 is etched using as a mask cap layer 108 made of the second insulating film to form a gate electrode having polysilicon layer 103 on the lower layer side and silicide layer 107 on the upper layer side with cap layer 108 provided on silicide layer 107 (FIG. 2(f). A source/drain diffusion layer is formed by a normal method at an appropriate stage after forming the gate electrode.

In this connection, in etching of the polysilicon film, a fourth insulating film of which the etching rate is lower than that of the polysilicon film may be formed on the entire surface and etched back to form side wall insulating film 130 made of the fourth insulating film on the side wall of cap layer 108 made of the second insulating film as necessary after removing first insulating film 104 and before etching polysilicon film 103 (FIG. 11(a)). Thereafter, polysilicon film 103 can be etched using cap layer 108 and side wall insulating film 130 as a mask to form a gate electrode (FIG. 11(b)).

After polysilicon film 103 is etched to form a gate electrode, third insulating film (second silicon nitride film) 109 is formed on at least the side surface of the gate electrode (FIG. 3(g)), and interlayer insulating film 110 is then formed (FIG. 3(h)).

Next, a mask is formed on the interlayer insulating film, and using the mask, the interlayer insulating film, third insulating film 109 and gate insulating film 102 are etched to form contact hole 111 (FIG. 3(i)).

The interlayer insulating film is preferably a film made of a material of which the etching rate is higher than that of cap layer 108 and third insulating film 109 at the time of forming the contact hole.

Third insulating film 109 is preferably formed of the same material as the material of cap layer 108 made of the second insulating film, and a silicon nitride film is preferably used. For the interlayer insulating film, a film (Low-K film) having a dielectric constant lower than that of a silicon oxide film, for example a silica-based insulating film using a disilazane-based material, or the like may be used. In this case, silicon nitride films are preferably used for the second insulating film and the third insulating film.

In the present invention, when interlayer insulating film 110 is etched using a mask to form contact hole 111, cap layer 108 made of the second insulating film of which the etching rate is lower than that of the interlayer insulating film is formed on the gate electrode, and third insulating film layer 109 of which the etching rate is lower than that of the interlayer insulating film is formed on the side surface of the gate electrode. Therefore, even when opening diameter D of the contact hole provided so as to extend to the top of the silicon substrate between adjacent gate electrodes is larger than minimum spacing L between the gate electrodes (see FIG. 3(i)), the gate electrode is not exposed even if the second or third insulating film is exposed in the hole when the interlayer insulating film is etched, and thus the contact hole can be formed in a self-aligned manner. Here, Opening diameter D of the contact hole is an opening diameter is an opening diameter on the top surface of the interlayer insulating film as shown in FIG. 3(i), and minimum spacing L between gate electrodes is the minimum length between adjacent gate electrodes on the silicon substrate as shown in FIG. 3(i).

This embodiment will be described in detail with examples.

EXAMPLE 1

The first example of the present invention will be described using the schematic process sectional views of FIGS. 1(a) to 3(i).

First, a silicon oxide film as gate insulating film 102 was formed on the surface of silicon substrate 100 having element isolation region 101 formed thereon using a normal thermal oxidization method, and polysilicon film 103 and silicon oxide film 104 were formed thereon in this order using a normal chemical vapor deposition (CVD) method.

As the gate insulating film, a silicon oxy-nitride film formed by nitriding a silicon oxide film in a nitrogen atmosphere may also be used.

Polysilicon film 103 may contain an impurity such as phosphor for the purpose of reducing the resistance of the wiring. Furthermore, an impurity may be introduced by an ion implantation method into polysilicon film 103 formed in a state of containing no impurity.

For element isolation region 101, a trench having a depth of 240 nm was formed on silicon substrate 100, and a silicon oxide film was buried in this trench to flatten the surface, whereby an element isolation region having a shallow trench isolation (STI) structure was formed.

The silicon oxide film as gate insulating film 102 had a thickness of 6 nm, polysilicon film 103 had a thickness of 120 nm, and silicon oxide film 104 had a thickness of 140 nm.

Next, photoresist pattern 105 having an opening corresponding to a region on which a gate electrode (including a gate wiring and a word line of a DRAM) would be formed subsequently was formed on silicon oxide film 104 by photolithography.

Thereafter, a normal anisotropic dry etching method was used to remove silicon oxide film 104 on a region (region in the opening) not covered with photoresist mask 105 using photoresist pattern 105 as a mask (FIG. 1(a)).

Thereafter, photoresist pattern 105 was removed using a plasma ashing method.

Next, a natural oxide film existing on the outermost surface of exposed polysilicon film 103 was removed by an agent liquid containing hydrogen fluoride, and cobalt film 106 having a thickness of 40 nm was then formed by a sputtering method so as to cover the entire surface of the substrate.

Thereafter, a heat treatment was carried out at 700° C. for 30 seconds using an RTA (rapid thermal annealing) method, and polysilicon film 103 was reacted with cobalt film 106 at a portion of mutual contact to form cobalt silicide layer 107 in a self-aligned manner (FIG. 1(*b*)).

The silicon substrate was immersed in an acidic agent liquid (mixed ratio of 35% hydrochloric acid:35% hydrogen peroxide solution:pure water=1:1:5 (volume ratio), liquid temperature of 70° C.) to remove unreacted cobalt remaining on the substrate, and a heat treatment was then carried out at 800° C. for 10 seconds using the RTA method to crystallize cobalt silicide layer 107.

A protective film such as a titanium nitride film may be formed on cobalt film 107 for preventing oxidization of cobalt.

This protective film can be removed by an acidic solution containing hydrogen peroxide, which is used for removal of unreacted cobalt. When only cobalt is removed, an acidic liquid such as sulfuric acid which does not contain hydrogen peroxide may be used.

In this connection, an example of forming cobalt silicide is described in this example, but instead of cobalt, nickel may be used to form nickel silicide.

Next, first silicon nitride film 108 having a thickness of 100 nm was formed on the silicon substrate using a normal CVD method (FIG. 1(*c*)).

Next, excess first silicon nitride film 108 was removed by CMP to expose a pattern of silicon oxide film 104 (FIG. 2(*d*)). Remaining silicon nitride film 108 becomes a cap layer.

For removal of excess silicon nitride film 13, wet etching by hot phosphoric acid heated to 100° C. or more, or dry etching may be used.

Next, wet etching by an agent liquid containing hydrogen fluoride (HF) was carried out to remove silicon oxide film 104 (FIG. 2(*e*)). Removal of silicon oxide film 104 may be performed by dry etching.

Next, a normal anisotropic dry etching method was used to remove polysilicon film 103 using first silicon nitride film (cap layer) 108 as a mask to obtain a pattern of a gate electrode (FIG. 2(*f*)).

Thereafter, a thermally oxidized film may be formed on the side surface of polysilicon 103 by carrying out a heat treatment in an oxidization atmosphere.

Next, second silicon nitride film 109 having a thickness of 20 nm was formed so as to cover the entire surface of the substrate using a normal CVD method (FIG. 3(*g*)).

Instead of second silicon nitride film 109, a laminated film consisting of a silicon nitride film and a silicon oxide film or a laminated film consisting of a plurality of silicon nitride films may be used. After forming these films, a side wall may be formed on the side surface of the gate electrode by dry etching, and a silicon nitride film may be formed again.

After forming the pattern of the gate electrode, ion implantation was carried out by a normal method at an appropriate stage to form a source and drain diffusion layer of an MOS (metal-oxide-semiconductor) transistor on a predetermined region of the silicon substrate (not shown). The source and drain diffusion layer may be formed at a desired stage, for example before or after forming second silicon nitride film 109, or after forming the side wall described previously.

Next, first interlayer insulating film 110 made of a silicon oxide film having a thickness of 600 nm was formed so as to cover the entire surface of the substrate by a normal CVD method (FIG. 3(*h*)).

Thereafter, normal anisotropic dry etching was carried out using a photoresist as a mask to remove first interlayer insulating film 110, second silicon nitride film 109 and gate insulating film 102 to form contact hole 111. Thereafter, the photoresist mask was removed by plasma ashing (FIG. 3(*i*)).

The silicon oxide film constituting first interlayer insulating film 110 may contain impurities such as boron and phosphor, and a laminated film made of a plurality of silicon oxide films may be used. After depositing first interlayer insulating film 110, the surface may be flattened by CMP.

In FIG. 3(*i*), a pair of FETs formed at the central part share a diffusion layer (common diffusion layer A) formed on silicon substrate 100 between the pair of FETs.

Next, a conductive material was buried in contact hole 111, the surface thereof was then flattened using a CMP method, and an excess conductive material was removed to form a plug in contact hole 111.

Figure 4:
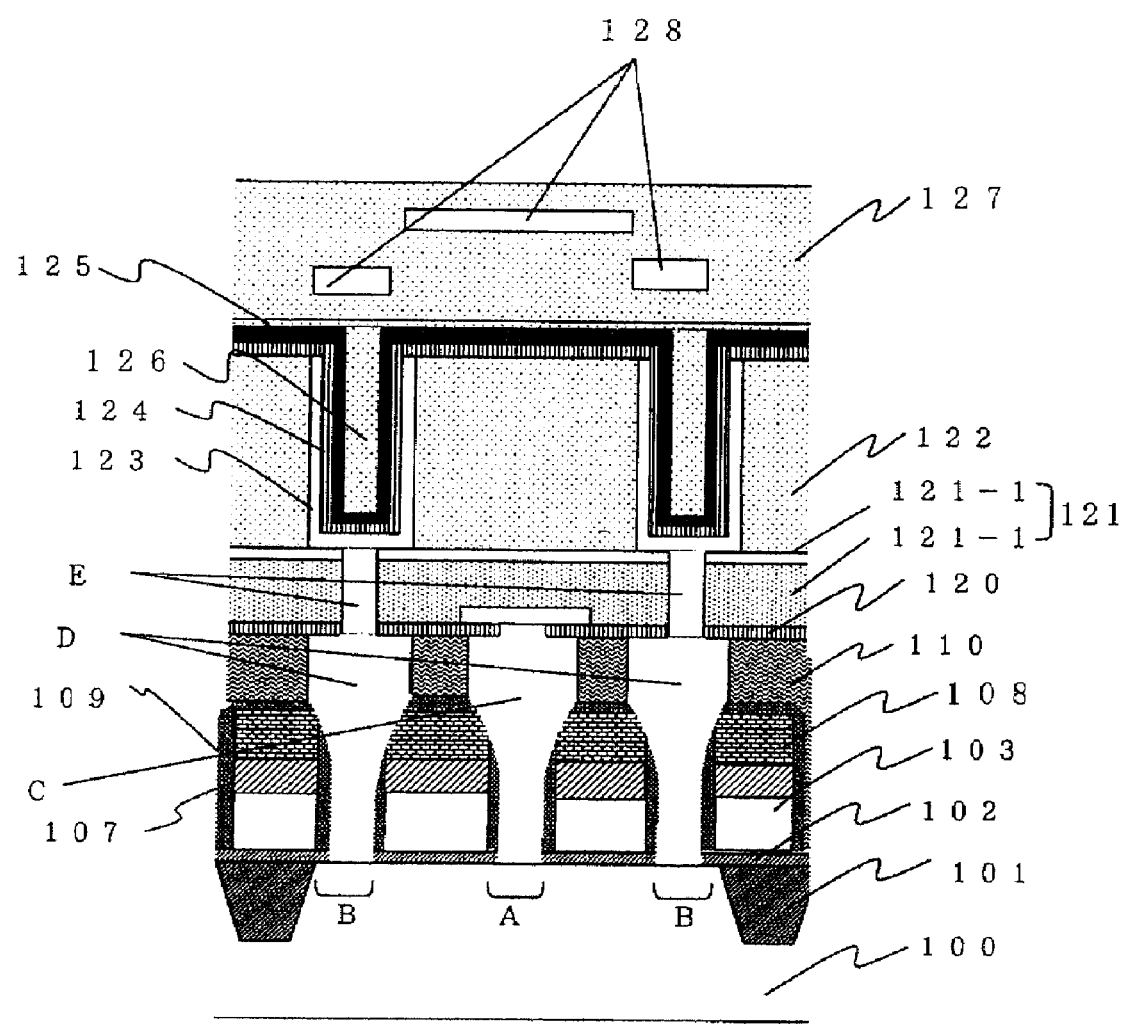
FIG. 4 is a schematic sectional view of one example of a DRAM obtained by the production method of the present invention.
Figure 7:
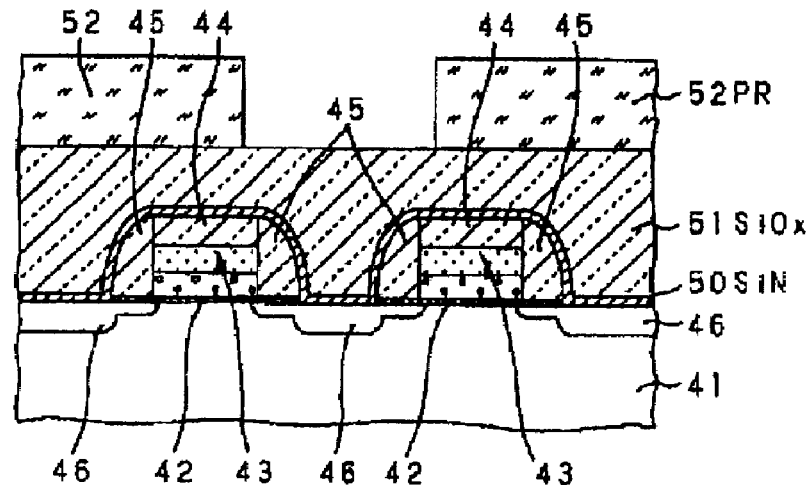
FIG. 7 is a schematic sectional view for explaining a conventional method for formation of a self-aligned contact structure (SAC)
Figure 8:
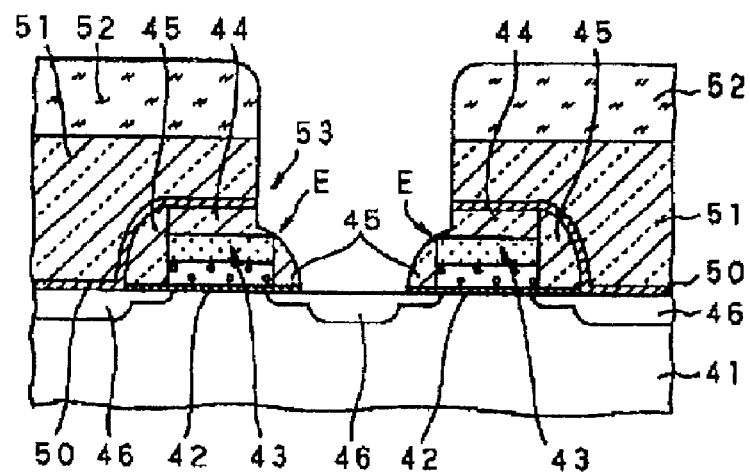
FIG. 8 is a schematic sectional view for explaining a conventional method for formation of a self-aligned contact structure (SAC)
Figure 9:
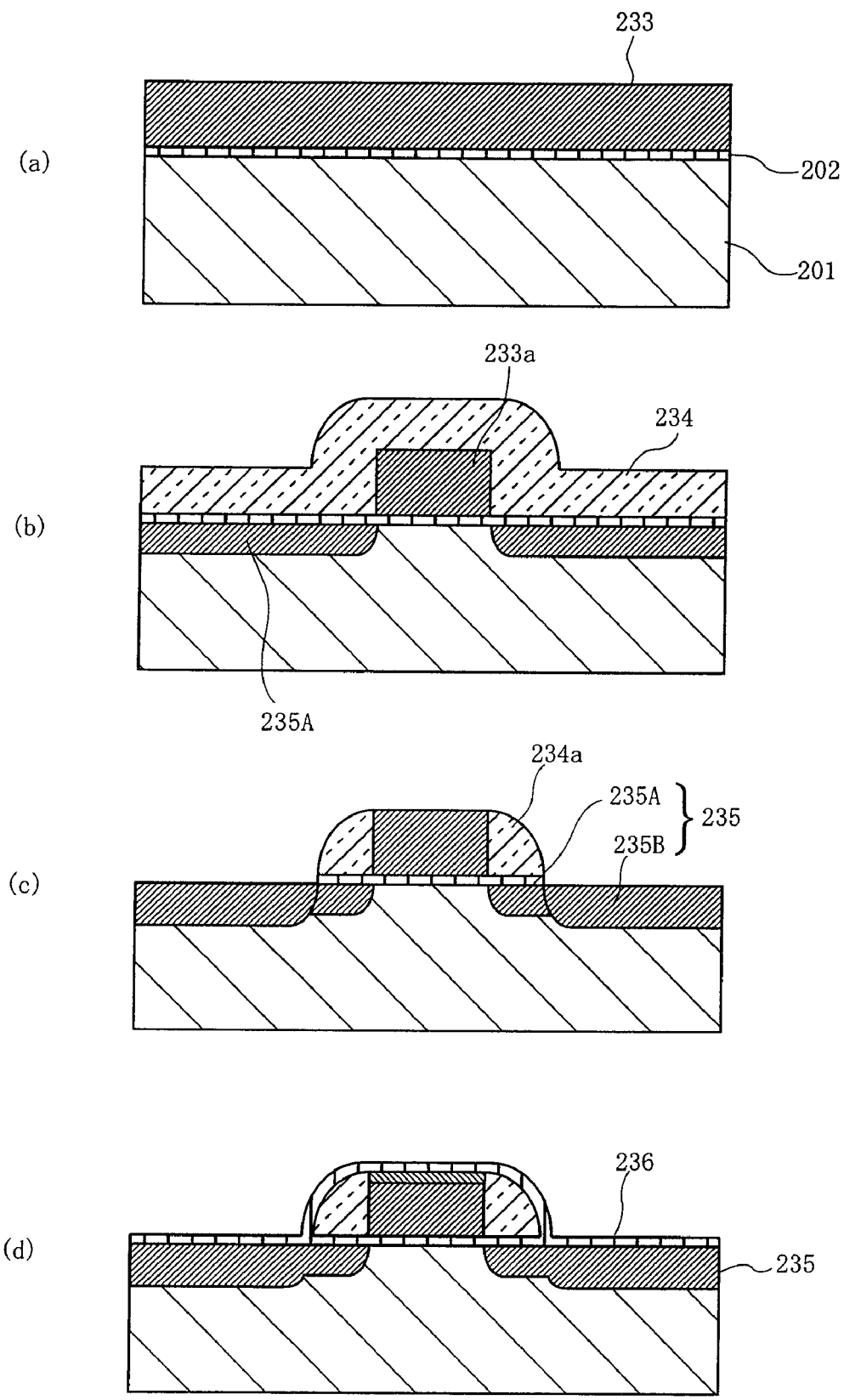
FIGS. 9(a), 9(b), 9(c) and 9(d) are schematic process sectional views for explaining a conventional method for formation of a salicide structure.
Figure 10:
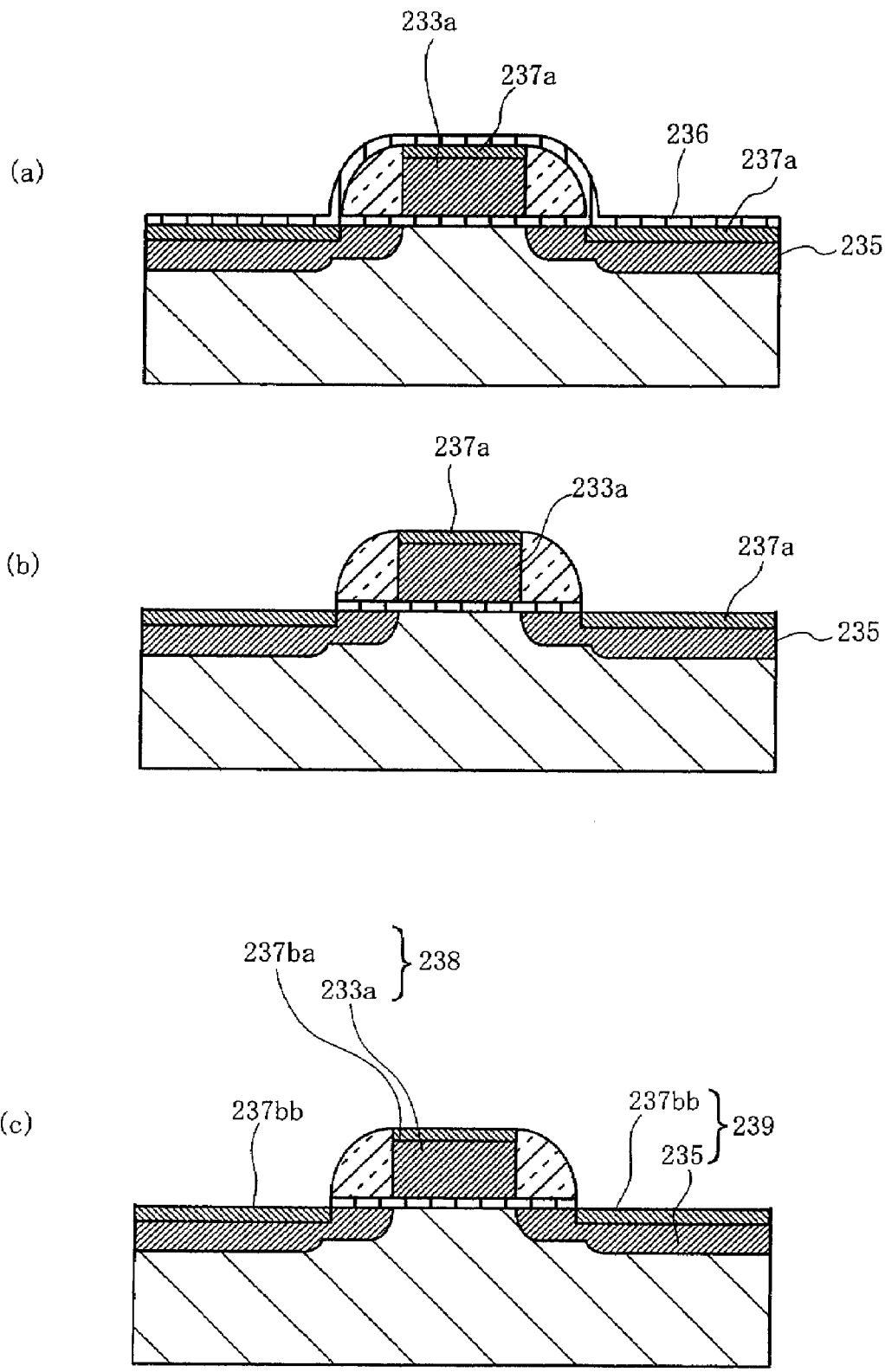
FIGS. 10(a), 10(b) and 10(c) are schematic process sectional views for explaining a conventional method for formation of a salicide structure.

FIG. 4 is a schematic sectional view showing one example of a DRAM prepared through the steps shown in FIGS. 1(*a*) to 3(*i*).

The plug formed in the contact hole extending to common diffusion layer A is referred to as first plug C, and the plug formed in the contact hole extending to diffusion layer B that is each of the other diffusion layers of a pair of FETs is referred to as second plug D.

After the plug was formed in contact hole 111, second interlayer insulating film 120 was formed, an opening extending to first plug C was then formed, a bit line of the DRAM was then formed on the opening, and the bit line was connected to first plug C.

Next, third interlayer insulating film 121 was formed. Third interlayer insulating film 121 shows a laminated film of interlayer insulating film 121-1 made of a silicon oxide film and silicon nitride film 121-2 as a hard mask, but it may be another laminated film consisting of two different types of insulating films capable of securing a sufficient etching selection ratio. This third interlayer insulating film may be a monolayer insulating film.

Next, a hole extending to second plug D was formed in the second interlayer insulating film and the third interlayer insulating film, and a conductive material was buried in this hole to form third plug E. Then, fourth interlayer insulating film 122 was formed, and a capacitance element connected to second plug D was formed. In FIG. 4, a cylindrical capacitance element was formed.

The cylindrical capacitance element is formed in a hole formed in fourth interlayer insulating film 122 and extending to third plug E.

After the hole extending to third plug E was formed in fourth interlayer insulating film 122, lower part electrode film 123 as a capacitance lower part electrode made of a conductive material was formed, and lower part electrode film 123 on interlayer insulating film 122 was removed using a CMP method. Then, dielectric film (insulating film) 124 was formed, followed by forming upper part electrode film 125 as a capacitance upper part electrode.

Thereafter, insulating film 126 was formed, and insulating film 126 was flattened, followed by forming interlayer insulating film 127. Wiring 128 was formed on interlayer insulating film 127 by a normal method.

EXAMPLE 2

The second example of the present invention will be described using the drawings.

Figure 11:
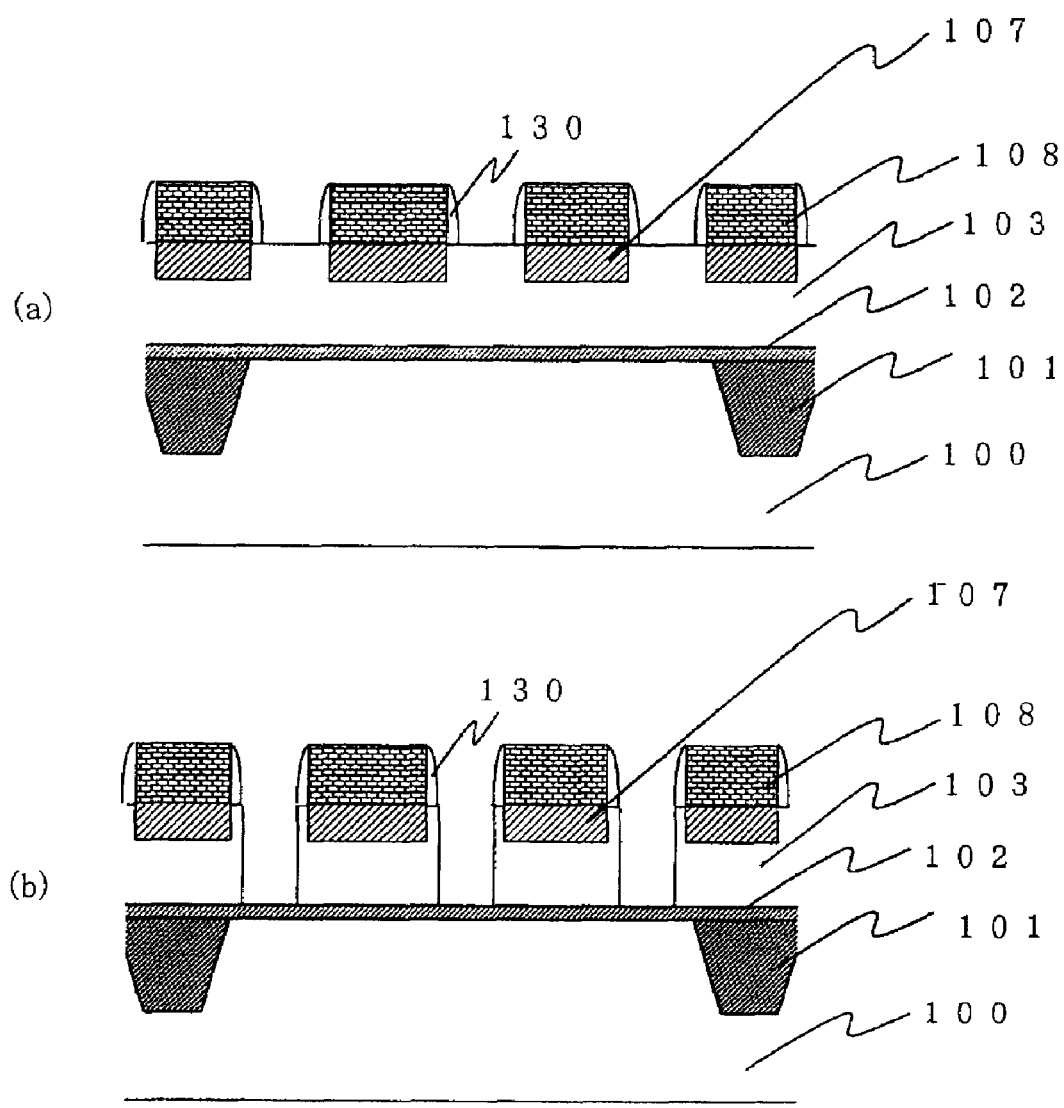
FIGS. 11(a) and 11(b) are schematic process sectional views showing a method for production of a semiconductor device of the present invention.

After steps up to the step shown in FIG. 2(*e*) in example 1 were carried out, a silicon nitride film having a thickness of 1 nm was formed using a CVD method, and then etched back to form side wall insulating film 130 made of a silicon nitride film on the side surface of cap layer 108 made of a silicon nitride film (FIG. 11(*a*)).

An anisotropic dry etching method was used to etch polysilicon film 103 using side wall insulating film 130 and cap layer 108 as a mask until gate oxide film 102 was exposed, so that a gate electrode was formed (FIG. 11(*b*)). Thereafter, the process of the step shown with FIG. 3(*g*) and the subsequent steps in example 1 is carried out.

In this example, as shown in FIG. 11(*b*), a silicide is not exposed at the side surface in the hole unlike FIG. 2(*f*) of example 1.

In example 1, when polysilicon film 103 is subjected to anisotropic dry etching after the step shown in FIG. 2(*e*), the silicide surface is exposed at the time of etching and exposed to a gas (fluoride of carbon) as an etchant for use in etching, since cap layer 108 as a mask is formed at a position where it overlaps silicide layer 107. In example 2, as shown in FIGS. 11(*a*) and 11(*b*), side wall insulating film 130 is formed on the side surface of cap layer 108, and therefore the silicide surface is not exposed at the time of etching polysilicon film 103 and is not exposed to a gas as an etchant for anisotropic dry etching. Therefore, a gate electrode can be formed without damaging the silicide layer at all.

The embodiments of the present invention have been described above, but the present invention is not limited to these embodiments, and various modifications can be made within the spirit of the present invention.

What is claimed is:

1. A method for production of a semiconductor device, comprising the steps of:
    forming a gate insulating film, a polysilicon film and a first insulating film on a silicon substrate;
    forming on the first insulating film a mask having an opening pattern corresponding to a pattern of a gate electrode which is subsequently formed;
    patterning the first insulating film by removing the first insulating film until said polysilicon film is exposed using said mask;
    forming on said polysilicon film a metal film for forming a silicide;
    forming a silicide layer by reacting said polysilicon film with said metal film contacting a portion not covered with the first insulating film;
    removing an unreacted metal film;
    forming on the polysilicon film having said silicide layer formed thereon, a second insulating film of which the etching rate is lower than that of the first insulating film in etching for removal of the first insulating film which is subsequently carried out;
    removing the second insulating film such that the first insulating film is exposed and the second insulating film remains on a region which is not covered with the first insulating film;
    removing the first insulating film by etching;
    forming a gate electrode having a silicide layer on the upper layer side and a polysilicon layer on the lower layer side by etching said polysilicon film using the remaining second insulating film as a mask;
    forming a third insulating film of which the etching rate is lower than an interlayer insulating film in etching for forming a contact hole in the interlayer insulating film which is subsequently formed, so as to cover at least the side surface of said gate electrode;
    forming the interlayer insulating film; and
    forming the contact hole in said interlayer insulating film by etching.

2. The method for production of a semiconductor device according to claim 1, wherein said metal film is a cobalt film or a nickel film.

3. The method for production of a semiconductor device according to claim 1, wherein the first insulating film is a silicon oxide film, and the second insulating film and the third insulating film are silicon nitride films.

4. The method for production of a semiconductor device according to claim 1, wherein said contact hole is provided so as to extend to the top of silicon substrate between adjacent gate electrodes, and the opening diameter of the contact hole is larger than the minimum spacing between the gate electrodes.

5. The method for production of a semiconductor device according to claim 1, wherein the method comprises a step of forming a side wall insulating film on the side surface of the second insulating film after the step of removing the first insulating film by etching, and in the step of forming said gate electrode, said polysilicon film is dry-etched using the side wall insulating film and the second insulating film as a mask such that said silicide layer is not exposed.

* * * * *